(12) United States Patent
Araki et al.

(10) Patent No.: US 11,043,358 B2
(45) Date of Patent: Jun. 22, 2021

(54) MEASURING APPARATUS AND METHOD OF SETTING OBSERVATION CONDITION

(71) Applicant: HITACHI HIGH-TECH CORPORATION, Tokyo (JP)

(72) Inventors: Ryoko Araki, Tokyo (JP); Natsuki Tsuno, Tokyo (JP); Yohei Nakamura, Tokyo (JP); Masahiro Sasajima, Tokyo (JP); Mitsuhiro Nakamura, Tokyo (JP); Toshihide Agemura, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/486,422

(22) PCT Filed: May 12, 2017

(86) PCT No.: PCT/JP2017/017993
§ 371 (c)(1),
(2) Date: Aug. 15, 2019

(87) PCT Pub. No.: WO2018/154800
PCT Pub. Date: Aug. 30, 2018

(65) Prior Publication Data
US 2020/0111638 A1    Apr. 9, 2020

(30) Foreign Application Priority Data
Feb. 23, 2017  (JP) .............................. JP2017-031694

(51) Int. Cl.
*H01J 37/00*     (2006.01)
*H01J 37/24*     (2006.01)
(Continued)

(52) U.S. Cl.
CPC ............ *H01J 37/243* (2013.01); *H01J 37/10* (2013.01); *H01J 37/244* (2013.01); *H01J 37/28* (2013.01); *H01J 2237/2809* (2013.01)

(58) Field of Classification Search
USPC ....................................................... 250/370
See application file for complete search history.

(56) References Cited

U.S. PATENT DOCUMENTS 5,160,884 A    11/1992 Todokoro et al.
7,123,330 B2 * 10/2006 Kondoh ............ G02F 1/133734
                                                        349/125
(Continued)

FOREIGN PATENT DOCUMENTS

JP    S58-197643 A    11/1983
JP    S62223960 A    10/1987
(Continued)

OTHER PUBLICATIONS

W. K. Wong et al.; "Charging Control Using Pulsed Scanning Electron Microscopy", Scanning, vol. 17, pp. 312-315 (1995).
(Continued)

*Primary Examiner* — Phillip A Johnston
(74) *Attorney, Agent, or Firm* — Miles & Stockbridge, P.C.

(57) ABSTRACT

A measuring apparatus that irradiates a sample with a charged particle beam to observe the sample includes a particle source that outputs the charged particle beam, a lens that collects the charged particle beam, a detector that detects a signal of emitted electrons emitted from the sample which is irradiated with the charged particle beam, and a control device that controls the output of the charged particle beam and the detection of the signal of the emitted electrons in accordance with an observation condition, in which the control device sets, as the observation condition, a first parameter for controlling an irradiation cycle of the charged (Continued)

particle beam, a second parameter for controlling a pulse width of the pulsed charged particle beam, and a third parameter for controlling detection timing of the signal of the emitted electron within the irradiation time of the pulsed charged particle beam, and the third parameter is determined in accordance with a difference in intensity of signals of the plurality of the emitted electrons emitted from the irradiation position of the charged particle beam.

17 Claims, 9 Drawing Sheets

(51) Int. Cl.
*H01J 37/10* (2006.01)
*H01J 37/244* (2006.01)
*H01J 37/28* (2006.01)

(56) References Cited

U.S. PATENT DOCUMENTS

| | | | |
|---|---|---|---|
| 7,830,341 B2 * | 11/2010 | Oooka | G09G 3/3225 345/76 |
| 8,907,279 B2 | 12/2014 | Tsuno et al. | |
| 9,236,220 B2 * | 1/2016 | Tsuno | H01J 37/244 |
| 9,443,694 B2 * | 9/2016 | Konishi | H01J 37/28 |
| 9,978,558 B2 * | 5/2018 | Shimizu | H01J 37/265 |
| 9,991,092 B2 * | 6/2018 | Cheng | H01J 37/28 |
| 10,020,163 B2 * | 7/2018 | Konishi | H01J 37/28 |
| 2003/0193026 A1 | 10/2003 | Takagi | |
| 2004/0026633 A1 | 2/2004 | Gunji et al. | |
| 2005/0045820 A1 | 3/2005 | Ohshima et al. | |
| 2007/0228276 A1 | 10/2007 | Makino et al. | |
| 2008/0116375 A1 | 5/2008 | Ikegami et al. | |
| 2014/0097342 A1 | 4/2014 | Tsuno et al. | |
| 2015/0041644 A1 | 2/2015 | Tsuno et al. | |

FOREIGN PATENT DOCUMENTS

| | | |
|---|---|---|
| JP | S631040 A | 1/1988 |
| JP | H02-295043 A | 12/1990 |
| JP | 2001338603 A | 12/2001 |
| JP | 2003303566 A | 10/2003 |
| JP | 2003331768 A | 11/2003 |
| JP | 2004-31379 A | 1/2004 |
| JP | 200571775 A | 3/2005 |
| JP | 2007-265931 A | 10/2007 |
| JP | 2008123716 A | 5/2008 |
| JP | 2012252913 A | 12/2012 |
| JP | 2013214467 A | 10/2013 |

OTHER PUBLICATIONS

S. Gorlich et al.; "Capacitive Coupling Voltage Contrast", Scanning Electron Microscopy, vol. II, pp. 447-464 (1986).

* cited by examiner

MEASURING APPARATUS AND METHOD OF SETTING OBSERVATION CONDITION

INCORPORATION BY REFERENCE

This application claims the priority of Japanese Patent Application No. 2017-31694 filed on Feb. 23, 2017, which is incorporated herein by reference.

TECHNICAL FIELD

The present invention relates to a measuring apparatus for observing a sample form using a charged particle beam. In particular, the present invention relates to an electron microscope.

BACKGROUND ART

In the electronics field, the size of devices such as semiconductors tends to be miniaturized year by year, adding an importance on obtaining internal information derived not only from the surface of the semiconductor but also from the bottom structure such as a diffusion phase.

In one example, a method of observing the semiconductor surface uses a scanning electron microscope. In the following description, a scanning electron microscope is also referred to as an SEM.

In the observation method mentioned above, the SEM scans the sample with a primary electron beam, and detects emitted electrons (Auger electrons, secondary electrons, reflected electrons, and the like) emitted from the sample by a detector. A detection signal in the emitting direction corresponding to the emitted electrons detected by the detector is sampled at a constant cycle. Sampling the signal of the emitted electrons is performed in synchronization with a scanning signal, and an extracted signal corresponding to a pixel in the two-dimensional image is obtained. The SEM converts the intensity of the extracted signal into brightness to generate an image, or generates an image from the relationship between coordinates and brightness under scanning with the primary electron beam.

The use of the SEM enables acquisition of an image with high spatial resolution only by adjusting focus and astigmatism, so that the SEM is used for observation of a minute shape of a sample surface, local composition analysis, and the like. In observing the sample with the SEM, the image quality can be improved by integrating extracted signals obtained by scanning the same location a plurality of times with the electron beam.

Recently, soft materials, such as organic materials and biomaterials, and samples such as composite materials are subjected to the observation using the SEM. When the soft materials or the composite materials are observed, the surface is easily charged by irradiating the surface with the electron beam, causing a problem of image drift and the sample damage during the observation. Therefore, the observation with a smaller irradiation amount of the electron beam is required. On the other hand, the techniques described in PTL 1 and PTL 2 are known.

PTL 1 discloses that "when using the electron beam to observe the structure of the sample and evaluate the characteristic of a material, the electron beam is directed intermittently, and a secondary electron signal reflecting necessary sample information is selected by the detection time in the transient response of secondary electrons obtained under intermittent electron beam irradiation, thus preventing superimposing of unnecessary information and achieving high-quality observation." Further, PTL 2 discloses that "steps of irradiating a fixed position in the observation region with a pulse-like intermittent electron beam, detecting a change of emitted electrons from a sample over time by the intermittent electron beam, and setting an observation condition of an electron microscope according to the change of the emitted electrons with time are included."

CITATION LIST

Patent Literature

PTL 1: JP 2012-252913 A
PTL 2: JP 2013-214467 A

SUMMARY OF INVENTION

Technical Problem

In recent years, in addition to the miniaturization of semiconductors, the determination of conduction and non-conduction of semiconductors, the inspection of the lower layer capacitance, and the shape, etc. become important as the structure becomes more complicated with the transition from two-dimensional to three-dimensional structure.

However, as the size of semiconductors has become smaller and the structure has become more complicated, the difference of the electrical characteristic in the diffusion layer has become smaller, so that charging becomes steady. Therefore, in the conventional potential contrast method, the difference of the charge amount becomes small and the inspection sensitivity becomes low, and it becomes extremely difficult to make an inter-plug gray scale. Further, in the case of a semiconductor having a complicated structure, an area in the vicinity of the plug to be observed receives a strong influence of surface charging in the conventional method, so that the potential contrast caused by the charging is superimposed on the SEM image, thus decreasing contrast difference. Further, when a small number of electrons is present for irradiation in the same pixel, an unnecessary signal to which no electrons are directed is sent, even when the accumulation number is increased, so that the image quality is not improved.

Solution to Problem

A representative example of the invention disclosed in the present application is described below. A measuring apparatus that irradiates a sample with a charged particle beam to observe the sample includes a particle source that outputs the charged particle beam, a lens that collects the charged particle beam, a detector that detects a signal of emitted electrons emitted from the sample which is irradiated with the charged particle beam, and a control device that controls the output of the charged particle beam and the detection of the signal of the emitted electrons in accordance with an observation condition, the control device sets a first parameter for controlling an irradiation cycle of the charged particle beam, as the observation condition, a second parameter for controlling a pulse width of a pulsed charged particle beam, as the observation condition, and a third parameter for controlling detection timing of the signal of the emitted electrons within the irradiation time of the pulsed charged particle beam, as the observation condition, and the third parameter is determined in accordance with a difference in intensity of signals of the plurality of emitted electrons emitted from the irradiation position of the charged particle beam.

Advantageous Effects of Invention

According to the present invention, a highly accurate potential contrast image of a sample can be generated by controlling the measuring apparatus in accordance with observation conditions including the first parameter, the second parameter, and the third parameter. Other problems, structures, and effects that are not described above will be apparent from the following description of the embodiment.

DESCRIPTION OF EMBODIMENTS

Hereinafter, embodiments of the present invention will be described with reference to the accompanying drawings. The attached drawings illustrate specific embodiments in accordance with the principle of the present invention, and provided for understanding the present invention, not for limiting interpretation of the present invention.

First Embodiment

In a first embodiment, an apparatus for generating an image (potential contrast image) on the basis of optimal observation conditions for observing a sample, and a method of setting the observation conditions will be described.

Figure 1:
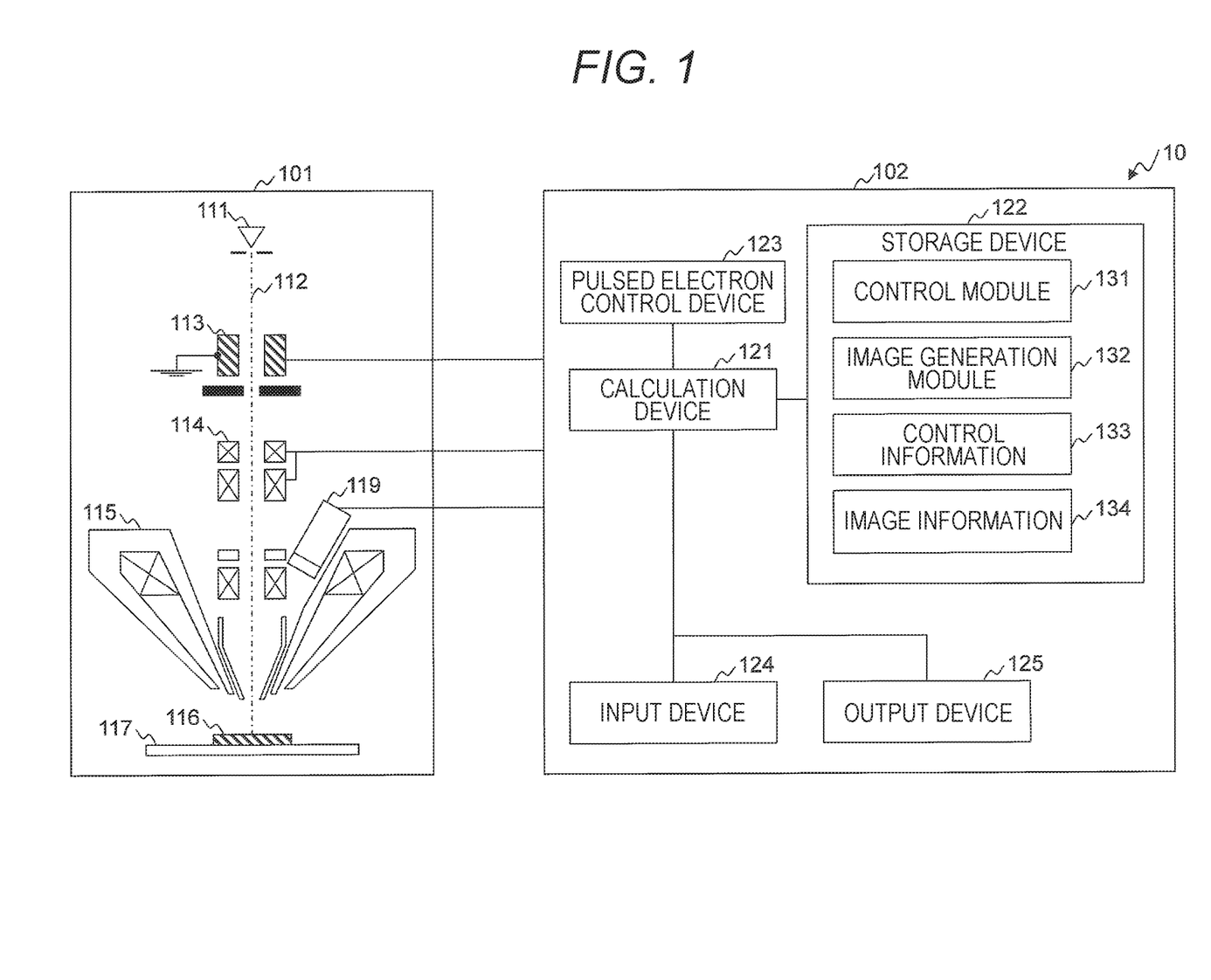
FIG. 1 illustrates an example structure of a scanning electron microscope according to an embodiment.
Figure 2:
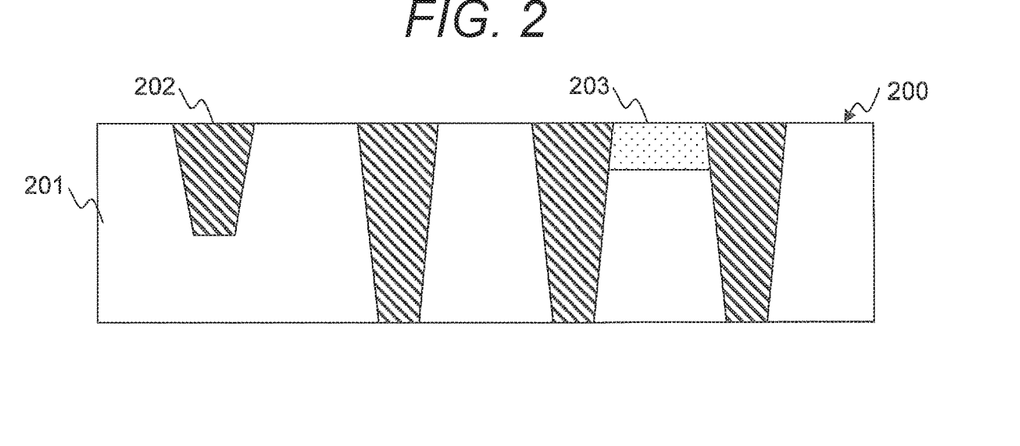
FIG. 2 illustrates an example of a sample observed using a scanning electron microscope of the first embodiment.

FIG. 1 illustrates an example structure of a scanning electron microscope 10 of the first embodiment. FIG. 2 illustrates an example of a sample to be observed using the scanning electron microscope 10 of the first embodiment.

In the first embodiment, the scanning electron microscope 10 is used as an exemplary measuring apparatus used for observing the sample. Alternatively, an electron microscope using an intermittent electron beam may be used.

The scanning electron microscope 10 includes an electronic optical system, a stage mechanism system, an SEM control system, a signal processing system, and an SEM operation system. More specifically, the scanning electron microscope 10 includes a lens barrel 101 of an electron optical system including an electron optical system and a stage mechanism system, and a control unit 102 including an SEM control system, a signal processing system, and an SEM operation system.

The electron optical system includes an electron gun 111, a deflector 113, an objective lens 115, and a detector 119. The electron gun 111 outputs a primary electron beam 112. In the present embodiment, a pulsed electron beam is emitted to a sample 116 as the primary electron beam 112. The pulsed electron beam may be output by controlling the deflector 113 corresponding to the pulse deflector or using an electron gun 111 capable of outputting a pulsed electron beam.

It is assumed that the number of electrons output from the electron gun 111 can be adjusted in the range of 1 to 10000, and that the incident energy can be adjusted in the range of 1 eV to 3000 eV.

The primary electron beam 112 is adjusted in its focusing or the like when passing through the deflector 113 and the objective lens 115. The primary electron beam 112 has its orbit deflected when passing through the deflector 113 and scans the sample 116 in two dimensions. The emitted electrons emitted from the sample 116 which is irradiated with the primary electron beam 112 are detected by the detector 119. Signals of the emitted electrons detected by the detector 119 are processed by the control unit 102. A two-dimensional image corresponding to the irradiation position of the primary electron beam 112 is displayed on the output device 125.

A stage mechanism system includes a sample holder 117 provided with a stage for placing the sample 116. The stage is subjected to tilt control and movement control in three-dimensional directions (XYZ axes). The sample 116 is assumed to be a semiconductor substrate 200 as illustrated in FIG. 2. The semiconductor substrate 200 includes an insulating film 201, a contact plug 202, a gate 203, and the like. The semiconductor substrate 200 illustrated in FIG. 2 is an example and is not limited thereto.

The control unit 102 includes a calculation device 121, a storage device 122, a pulsed electron control device 123, an input device 124, and an output device 125. The control unit 102 may include a storage medium such as a hard disk drive (HDD) and a solid state drive (SSD).

The calculation device 121 executes predetermined calculation processing in accordance with a program stored in the storage device 122. The calculation device 121 may be, for example, a central processing unit (CPU) or a graphics processing unit (GPU).

The storage device 122 stores a program executed by the calculation device 121 and data used by the program. The storage device 122 also includes a temporary storage area such as a work area used by the program. The storage device 122 may be, for example, a memory. The programs and data stored in the storage device 122 will be described later.

The pulsed electronic control device 123 controls the output of the pulsed electron beam. The pulsed electronic control device 123 of the present embodiment is connected in a communicable manner to the deflector 113.

The input device 124 is a device for inputting data, and includes a keyboard, a mouse, a touch panel, and the like. The output device 125 is a device that outputs data, and includes a touch panel, a display, and the like.

The storage device 122 stores a program for realizing the control module 131 and the image generation module 132. Further, the storage device 122 stores condition information 133 and image information 134. The storage device 122 may store programs and information (not illustrated).

A control module 131 controls constituent components in the lens barrel 101 of the electron optical system. The image generation module 132 generates an image from the signals of the emitted electrons. In the present embodiment, the control module 131 or the image generation module 132 samples the signals of the emitted electrons.

Condition information 133 is information for controlling observation conditions. The observation conditions are generated as data (entry) associated with an acceleration voltage, an irradiation current, a pulse width (irradiation time), a pixel split number (irradiation cycle), a timing delay, a pointer indicating storage position of image, and so on, and registered in the condition information 133. The entry may include identification information, type, and the like of the sample 116. Image information 134 is information for managing the generated potential contrast image.

In the present embodiment, the SEM control system includes the control module 131 and the pulsed electron control device 123, the signal processing system includes the image generation module 132, and the SEM operation system includes the input device 124 and the output device 125.

Figure 3:
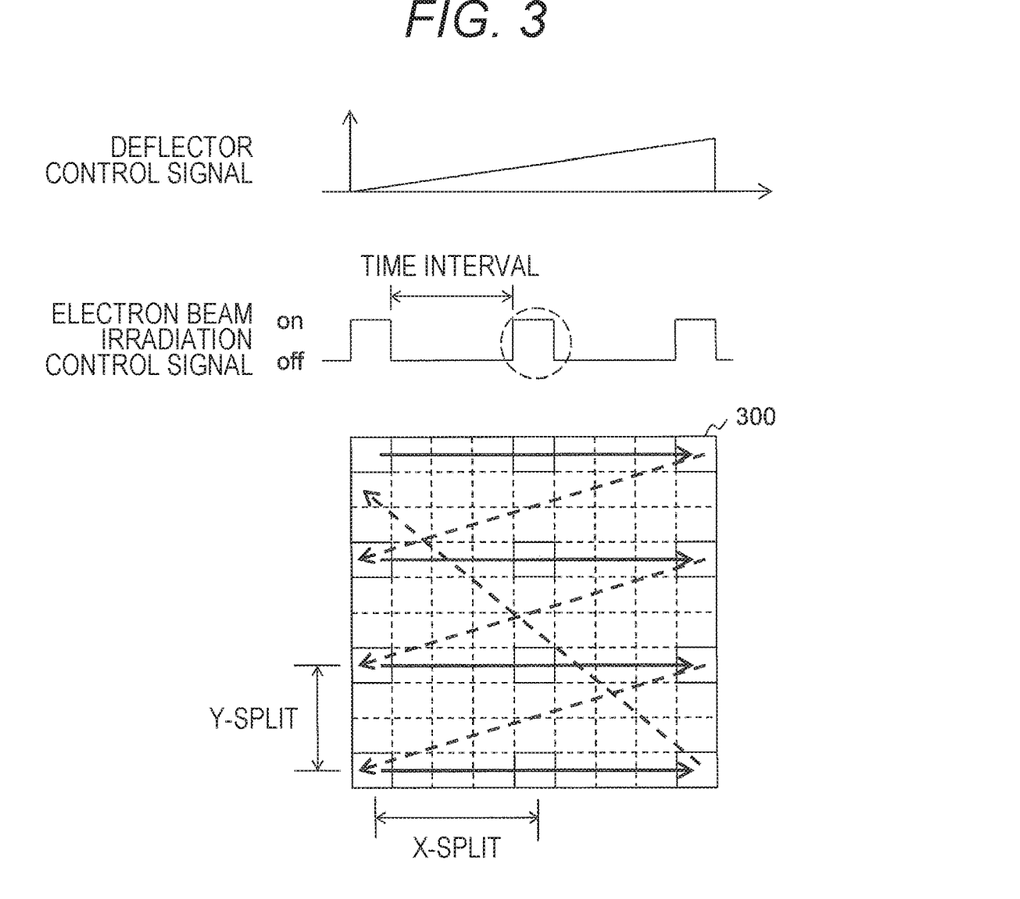
FIG. 3 is an explanatory diagram for explaining a control method of the scanning electron microscope of the first embodiment.
Figure 4:
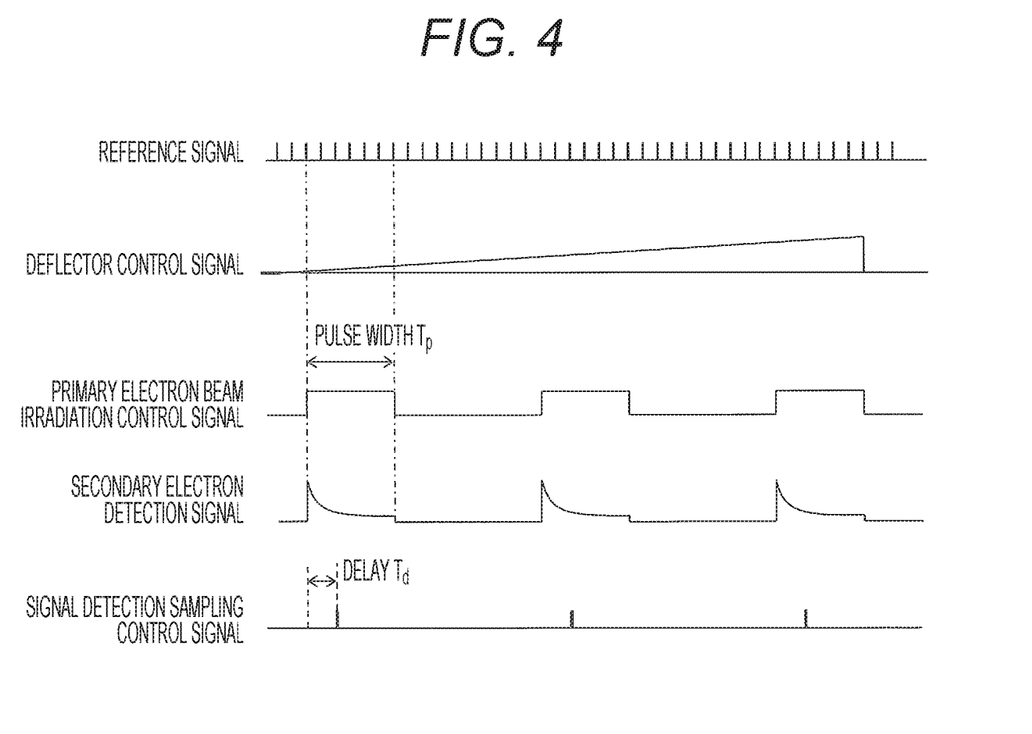
FIG. 4 is an explanatory diagram for explaining the control method of the scanning electron microscope of the first embodiment.

FIGS. 3 and 4 are explanatory diagrams for explaining a control method of the scanning electron microscope 10 of the first embodiment. FIG. 3 illustrates scanning control using the pulsed electron beam, and FIG. 4 illustrates sampling control of the scanning electron microscope 10.

A rectangle 300 indicates the irradiation range of the primary electron beam 112. In FIG. 3, the scanning electron microscope 10 starts scanning from the upper left of the rectangle 300 to the lower left of the rectangle 300 with the primary electron beam 112. The specific scanning trajectory of the primary electron beam is as illustrated by arrows in FIG. 3. Movement in the X direction during the scanning control is based on a control signal to the deflector 113.

The pulsed electron control device 123 cooperates with the control module 131 to control the scanning with the pulsed electron beam, and the image generation module 132 controls the detection timing of the emitted electrons. It is possible to achieve the scan control synchronized with the irradiation of the pulsed electron beam, and acquire a potential contrast image from the signals of the emitted electrons detected in synchronization with the irradiation of the pulsed electron beam.

A conventional scanning electron microscope irradiates the sample 116 with the primary electron beam 112 by adjusting a scanning speed and a probe current to control an electron irradiation density (scanning line density) of the primary electron beam 112 emitted to the sample 116 in a single scan.

Electrons emitted from the sample 116 are strongly affected by the surface charge in the vicinity of the observation target. When the interaction between the emitted electrons and the charge is weak, a potential contrast image having a smaller influence of the charge is obtained, but when the interaction between the emitted electrons and the charge is strong, the potential contrast due to the charge is superimposed on the SEM image. Further, the interaction between the emitted electrons and the charge strongly depends on the electrical characteristic of the sample 116.

The scanning electron microscope 10 of the present embodiment irradiates the sample 116 with the pulsed electron beam in accordance with pixel split control to solve the problem mentioned above. Accordingly, the charge of the sample 116 can be controlled, and the transient state of charging of the sample 116 can be visualized.

In the pixel split control, the scanning line density, the time interval of irradiation of the pulsed electron beam, and the pulse width of the pulsed electron beam are controlled. More specifically, in addition to the control of the scanning speed and the scanning line density for adjusting the probe current, the time interval (irradiation cycle) and the pulse width of irradiation of the pulsed electron beam are controlled for each pixel in the scanning direction (X direction). The charge of the sample 116 can be highly controlled when the control in the Y direction is combined.

FIG. 3 is a graph of the polarizer control signal and the electron beam irradiation control signal, where the horizontal axis represent time and the vertical axis represents a signal intensity. As the intensity of the polarizer control signal increases, the irradiation position of the primary electron beam 112 moves in the X direction. Further, in accordance with the electron beam irradiation control signal, the sample 116 is irradiated with the pulsed electron beam at constant time intervals from the left end to the right end. When the scanning electron microscope 10 reaches the right end, that is, when the intensity of the polarizer control signal changes to the initial value, the scanning electron microscope 10 moves to the scanning line spaced by a predetermined distance in the Y direction to irradiate the sample 116 from the left end to the right end. If the downward movement along the Y direction is not allowed, the scanning electron microscope 10 moves to the uppermost scanning line among unprocessed scanning lines and performs similar processing.

In order to obtain a potential contrast image according to the difference in the electrical characteristics of the sample, the present control is effective as it being capable of adjusting the interaction between the charge in the vicinity of the observation object and the emitted electrons.

The scanning electron microscope 10 of the present embodiment adopts pixel split control, and further implements a dynamic potential contrast method to obtain a highly accurate potential contrast image.

The reference signal illustrated in FIG. 4 is a signal serving as an operation reference of the SEM control system and the signal processing system. The control unit 102 of the present embodiment performs control using a control signal for signal detection sampling, in addition to the control using the polarizer control signal and the primary electron beam irradiation control signal described above. The control signals are controlled to synchronize with the reference signal. The control unit 102 can adjust each control signal with an accuracy of $1/10$ of the time resolution of the reference signal.

Time for which the pulsed electron beam per pixel in the TV scanning lines stays on the sample 116 is equal to irradiation time, that is, a pulse width Tp, of the pulsed electron beam. The detection signal of the emitted electrons indicates a signal of the detected emitted electrons. As illustrated in FIG. 4, the intensity of the signal decreases with time.

The image generation module 132 performs sampling so as to detect emitted electrons once at any timing during irradiation of the pulsed electron beam. The detection timing is adjusted using a timing delay Td that indicates a delay time from the start of irradiation of the pulsed electron beam.

In the present embodiment, the control condition regarding the output of the pulsed electron beam and the control condition regarding the detection timing of the signal of the emitted electron are set as the observation condition. In the following, a control condition regarding irradiation of the pulsed electron beam is described as the scanning condition, and a control condition regarding detection timing of the signal of the emitted electrons is also described as a detection condition.

In the present embodiment, the detection timing is determined to be in the range of 10 MHz to 1000 MHz.

Here, a reason for obtaining a highly accurate potential contrast image by adjusting the detection timing of the signal of emitted electrons is described below with reference to FIG. 5.

Figure 5:
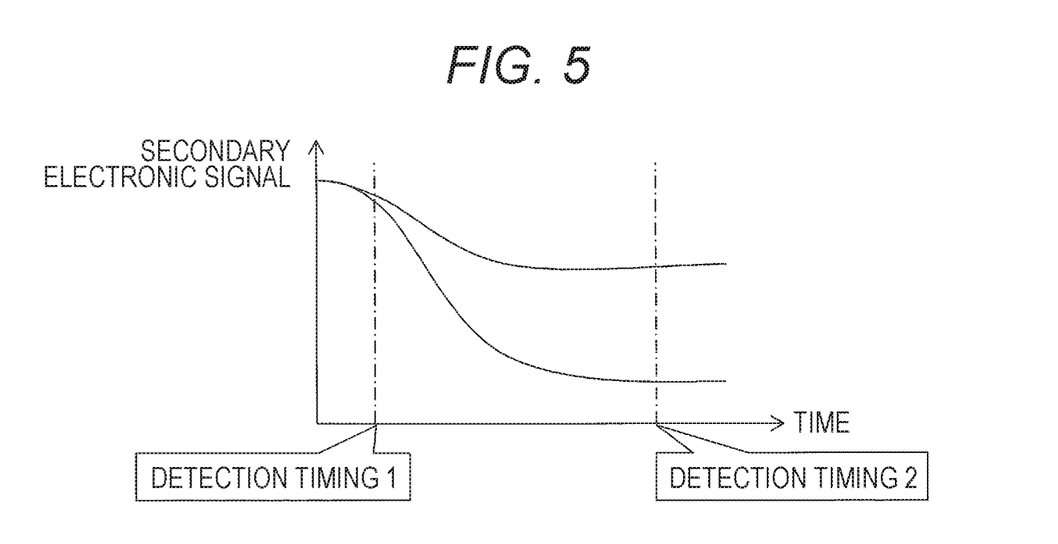
FIG. 5 is an explanatory diagram for explaining the principle of a dynamic potential contrast method of the first embodiment.

FIG. 5 is a diagram for explaining the principle of the dynamic potential contrast method of the first embodiment.

When the sample 116 as illustrated in FIG. 2 is irradiated with a pulsed electron beam, the emitted electrons emitted from the adjacent contact plug 202 are detected. The emitted electron beam changes as illustrated in FIG. 5. Here, the horizontal axis of FIG. 5 indicates time, and the vertical axis indicates the intensity of the signals of the emitted electrons such as current.

When the image generation module 132 detects the signal of the emitted electron at detection timing 1, the intensity of the signal of the emitted electrons emitted from the adjacent contact plug 202 is substantially the same intensity, so that the potential contrast image having no contrast difference is generated. On the other hand, when the image generation module 132 detects the signal of the emitted electrons at detection timing 2, the intensity of the signal of the emitted electrons emitted from the adjacent contact plug 202 is different, so that the potential contrast image including the contrast difference is generated. It is difficult to obtain a highly accurate potential contrast image when the detection timing is set at a later point along the time axis, because the intensity of the signal of the emitted electrons, which is emitted along with charging of the sample 116, decreases with time. The temporal change of the intensity of the signal of the emitted electrons mainly depends on the pulse width.

In the present embodiment, the detection timing is adjusted so as to obtain an optimal potential contrast image in consideration of the temporal change (transient characteristic) of the emitted electrons as described above.

Figure 6:
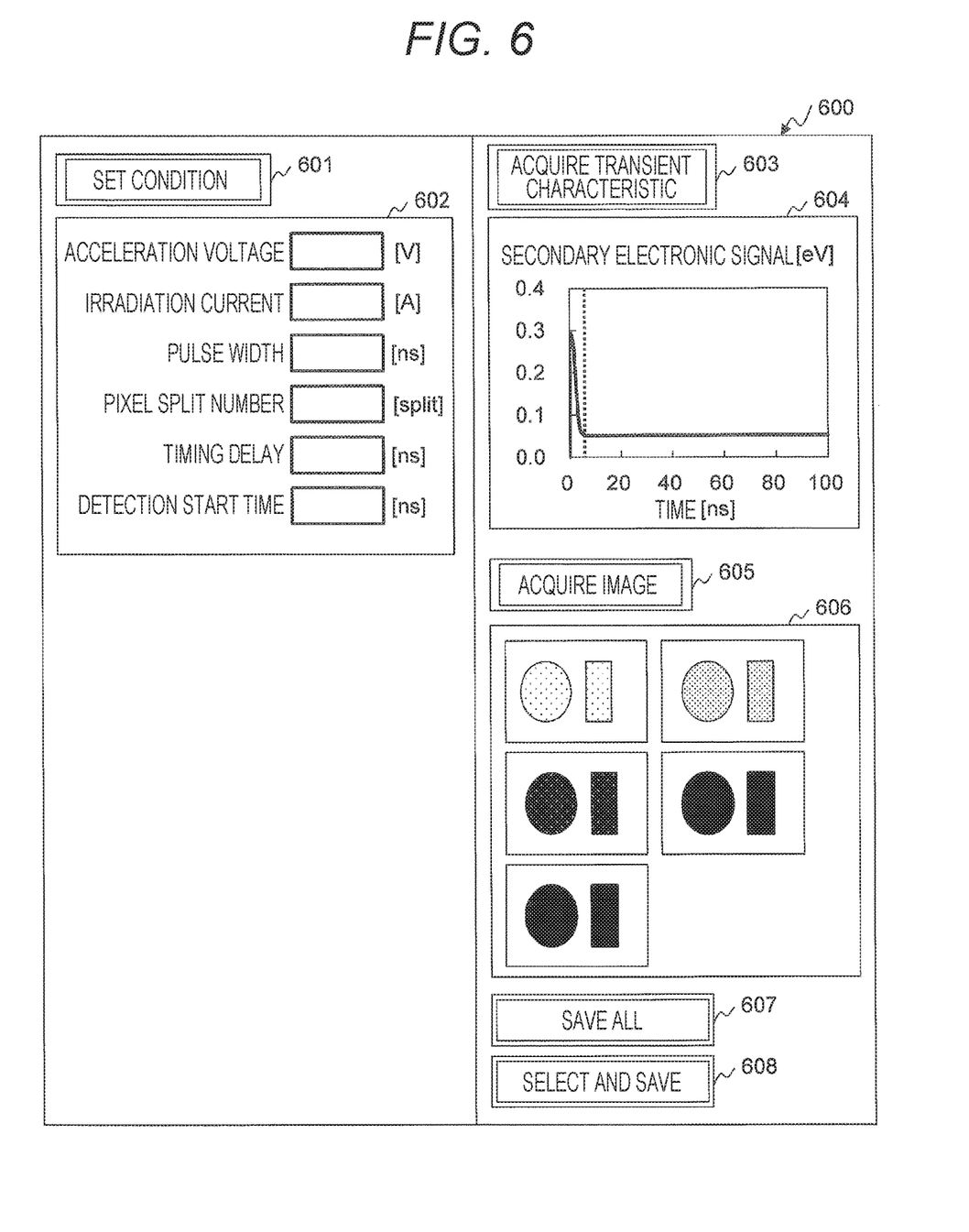
FIG. 6 illustrates an example of an operation screen displayed on an output device of the first embodiment.
Figure 7:
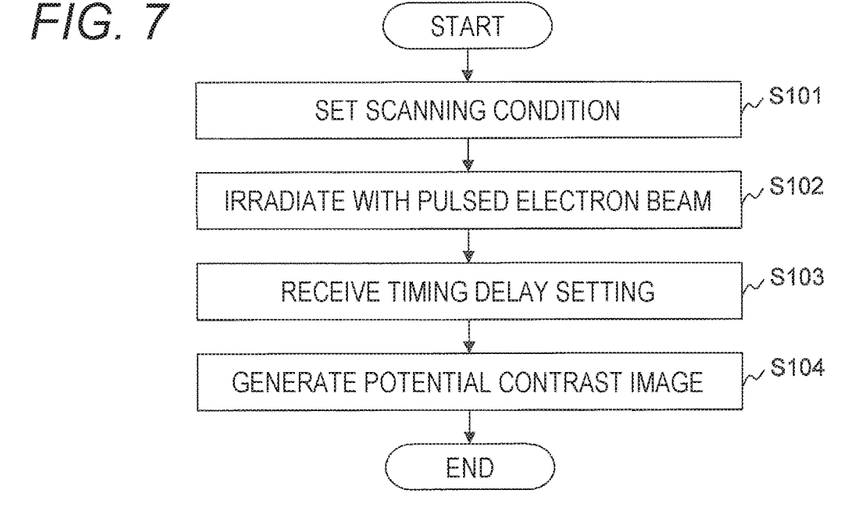
FIG. 7 is a flowchart illustrating processing executed by the scanning electron microscope of the first embodiment to set observation conditions.

Next, a method of setting observation conditions is described using FIGS. 6 and 7.

FIG. 6 illustrates an example of an operation screen 600 displayed on the output device 125 according to the first embodiment.

The operation screen 600 is a screen which appears during setting of the observation condition, and includes a condition setting button 601, a condition setting area 602, a transient characteristic acquisition button 603, a transient characteristic display area 604, an image acquisition button 605, an image display area 606, and save buttons 607 and 608.

The condition setting button 601 is an operation button for setting the value set in the condition setting area 602 as a parameter to be included in the observation condition. When the condition setting button 601 is operated, the control unit 102 temporarily stores, in the storage device 122, the observation condition including the value set in the condition setting area 602.

The condition setting area 602 is an area for setting an observation condition. The condition setting area 602 includes an acceleration voltage field, an irradiation current field, a pulse width field, a pixel split number field, a timing delay field, and a detection start time field.

The acceleration voltage field, the irradiation current field, the pulse width field, and the pixel split number field are fields for inputting parameters to be set as scanning conditions. The pulse width field is for a parameter that specifies the pulse width of the pulsed electron beam, that is, the time for which the electron beam continues to be applied to the sample 116, that is, the irradiation time. The pixel split number field is for a parameter that specifies the number of pixels specifying the irradiation position, that is, the irradiation cycle of the pulsed electron beam.

The timing delay field and the detection start time field are fields for inputting parameters to be set as detection conditions. Here, the timing delay field is a field for specifying a parameter for determining the detection timing of the emitted electrons. The detection start time field is a field for specifying an initial value of timing delay when a plurality of potential contrast images are acquired to determine the timing delay.

When the transient characteristic acquisition button 603 is operated, no value may be set in the timing delay field and the detection start time field.

The transient characteristic acquisition button 603 is an operation button for acquiring a graph illustrating a temporal change of the intensity of the signal of the emitted electron. The scanning electron microscope 10 of the present embodiment, upon receipt of the operation of the transient characteristic acquisition button 603, irradiates the sample 116 with the pulsed electron beam in accordance with the observation conditions, and stores data indicating the temporal change of the signal of the emitted electrons in the storage device 122. The transient characteristic display area 604 is an area for displaying a graph illustrating the temporal change of the intensity of the signal of the emitted electrons.

The image acquisition button 605 is an operation button for giving an instruction on generation of the potential contrast image. The image display area 606 is an area for displaying the potential contrast image generated by sampling signals of the emitted electrons detected in accordance with the designated timing delay.

The save buttons 607 and 608 are operation buttons for registering the set observation conditions in the condition information. When the save button 607 is operated, the control unit 102 registers, in the condition information 133, the observation conditions used when generating all the potential contrast images displayed in the image display area 606. When the save button 608 is operated, the control unit 102 registers, in the condition information 133, the observation condition used when generating the potential contrast image selected from the image display area 606.

The user can set observation conditions including optimal parameters without trial and error by referring to the graph of the temporal change of the signal of the emitted electrons and the potential contrast image.

FIG. 7 is a flowchart for explaining the processing executed when the scanning electron microscope 10 of the first embodiment sets the observation conditions.

When the transient characteristic acquisition button 603 is operated, the scanning electron microscope 10 starts processing described below.

The control unit 102 sets scanning conditions in the lens barrel 101 of the electron optical system (step S101).

Specifically, the control module 131 outputs a setting instruction including scanning conditions to the pulsed electron control device 123. As a result, the field of view, an acceleration voltage, and the number of pixel splits are set in the lens barrel 101 of the electron optical system.

The control unit 102 instructs the lens barrel 101 of the electron optical system to irradiate the sample 116 with the pulsed electron beam (step S102).

Upon receipt of the instruction, the lens barrel 101 of the electron optical system periodically irradiates the sample 116 with the pulsed electron beam having a predetermined pulse width on the basis of the scanning conditions set by the pulsed electron control device 123.

At this time, the control module 131 records, in the storage device 122, data indicating the temporal change of the signal of the emitted electrons detected by the detector 119. After the recording is completed, the control unit 102 outputs, to the output device 125, a message prompting the user to operate the transient characteristic acquisition button 603.

The control unit 102 displays a graph illustrating the temporal change of the intensity of the signal of the emitted electrons, and receives the setting of the timing delay (step S103).

Specifically, when accepting the operation of the transient characteristic acquisition button 603, the control module 131 generates a graph from the data recorded in the storage device 122, and displays the generated graph in the transient characteristic display area 604. Alternatively, this may be set automatically by the control module 131. For example, the control module 131 determines the detection timing at which the difference between the plurality of signals is maximum on the basis of the temporal change of the signal of the emitted electrons, and sets the timing delay corresponding to the detection timing.

The user sets a value in the timing delay field or the detection start time field of the condition setting area 602 according to the graph. The user also operates the image acquisition button 605.

The control unit 102 samples the signal of the emitted electrons on the basis of the set timing delay and, when receiving the operation of the image acquisition button 605, generates the potential contrast image (step S104).

Specifically, the image generation module 132 samples the signal of the emitted electrons detected by the detector 119 on the basis of the set timing delay, and generates the potential contrast image using the sampled signal of the emitted electrons. In other words, the image generation module 132 refers to the graph of the temporal change of the signal of the emitted electrons, and obtains the value of the time corresponding to the detection timing.

The image generation module 132 also outputs the potential contrast image to the image display area 606 of the operation screen 600 displayed on the output device 125. The image generation module 132 outputs the potential contrast image and the time delay in association with each other.

The user refers to the displayed potential contrast image and registers the observation conditions corresponding to the optimal potential contrast image in the condition information 133. When the save button 607 or 608 is operated, the control module 131 sets the time delay associated with the selected potential contrast image as the detection condition, and generates the observation conditions including the scanning condition set in step S101. The control module 131 registers the observation conditions in the condition information 133.

Note that the method of setting the time delay in the observation condition and the method of registering the observation condition in the condition information 133 are only examples, and the present invention is not limited to these methods.

When a value is set in the detection start time field, the image generation module 132 uses this value as a reference value and sets a plurality of candidate timing delays (detection timings). Further, the image generation module 132 generates a potential contrast image corresponding to each detection timing. For example, the image generation module 132 uses the value in the detection start time field as a reference value, and sets the candidate timing delay by shifting it to about 20 ns. When a value is set in the timing delay field, the control unit 102 sets a detection timing corresponding to the uniquely determined timing delay, and generates a potential contrast image corresponding to the detection timing.

In the present embodiment, the user refers to the image and registers the observation condition, but the control module 131 may automatically set the timing delay. For example, in the case of the graph illustrated in FIG. 5, the control module 131 sets the time at which the difference between the intensities of the two signals of the emitted electrons is maximum as the detection timing. In this case, the processing described above is performed instead of the processing of steps S103 and S104. When three or more signals of the emitted electrons are present, the control module 131 sets the time at which the sum of the differences in intensity of the respective signals is minimum as the detection timing.

After completion of setting the observation conditions, the sample 116 is actually observed. When receiving the observation request of the sample 116, the control unit 102 of the present embodiment acquires the observation condition from the condition information, and controls the output of the pulsed electron beam and the detection of the signal of the emitted electrons on the basis of the observation conditions. Specifically, the pulsed electron beam is emitted to the sample 116 on the basis of the scanning conditions including parameters such as the scanning line density, the time interval of irradiation of the pulsed electron beam to the sample 116, and the pulse width. Meanwhile, the signal of the emitted electrons is sampled on the basis of the detection conditions including the timing delay, and the image is generated using the sampled signals.

Figure 8:
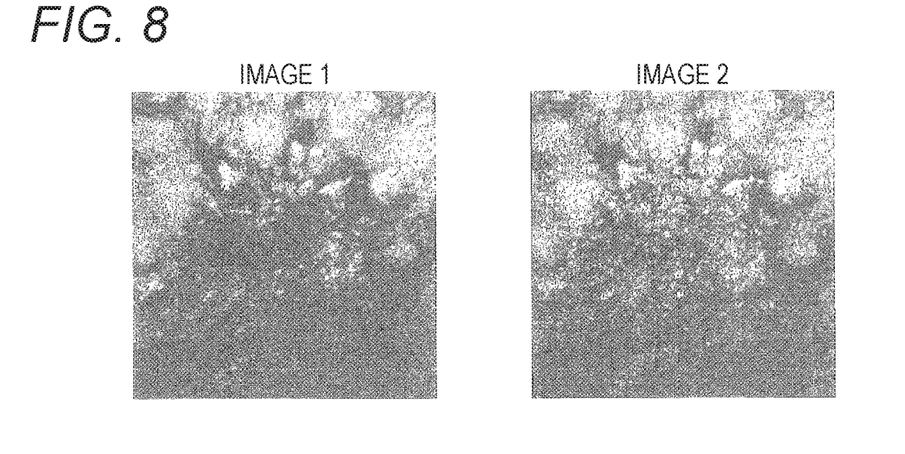
FIG. 8 illustrates example images generated by the scanning electron microscope of the first embodiment.

FIG. 8 is a view illustrating example images generated by the scanning electron microscope 10 of the first embodiment.

An image 1 is a potential contrast image when the timing delay is small. The image 1 is, for example, an image generated from the signal of the emitted electrons detected at the detection timing 1 of FIG. 5. An image 2 is a potential contrast image when there is a long timing delay. The image 2 is, for example, an image generated from the signal of the emitted electrons detected at the detection timing 2 of FIG. 5. It is possible to examine the structure of the sample 116 with high accuracy in the image 2, as the contrast of the image 2 is clearer than the contrast of the image 1.

According to the first embodiment, the scanning electron microscope 10 can generate a high precision potential contrast image of the sample 116 having a fine structure.

Second Embodiment

A second embodiment differs from the first embodiment in that the observation conditions are set on the basis of simulation using design data of the sample 116. The second embodiment will be described below by focusing on the difference from the first embodiment.

The structure of the scanning electron microscope 10 of the second embodiment is the same as the structure of the scanning electron microscope 10 of the first embodiment, and the description thereof is not repeated. Further, the control method of the scanning electron microscope 10 on the basis of the dynamic potential contrast method to be used is the same as the control method of the first embodiment, and the description thereof is not repeated.

In the second embodiment, it is assumed that design data (RC constant) of the sample 116 is known in advance, and electrical characteristics of the sample 116 are modeled using an equivalent circuit.

Figure 9:
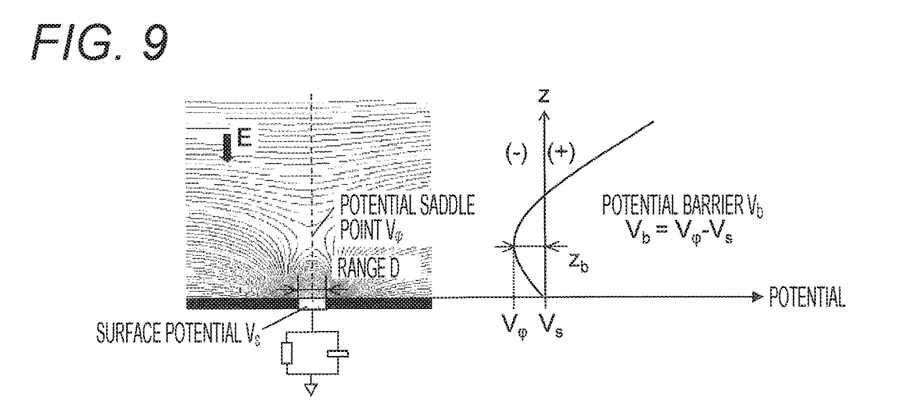
FIG. 9 illustrates a model used in simulation of a second embodiment.

FIG. 9 illustrates a model used for the simulation of the second embodiment.

In the second embodiment, as illustrated in FIG. 9, a potential contrast image is simulated by the dynamic potential contrast method using an energy distribution model of the emitted electrons in which a potential saddle point generated by the surface potential due to charging is present.

The left side of FIG. 9 illustrates a distribution of the electric potential, and the right side of FIG. 9 is a graph illustrating the change of the electric potential.

In the model illustrated in FIG. 9, when the sample 116 is irradiated with the pulsed electron beam, a surface potential $V_s$ is generated depending on the electrical characteristics of the sample 116, and a potential saddle point $V_\varphi$ is generated from the interaction of the electrolysis in the Z direction and the surface potential of the sample in the surface of the sample 116. The potential saddle point has a negative potential with respect to the surface potential, and acts as an energy barrier $V_b$ relative to the emitted electrons. The energy barrier is given as the difference between the potential saddle point and the surface potential. As the surface potential increases, the emission current (signal intensity) of the emitted electrons decreases and the chargeability decreases.

In the present embodiment, the integral value of the energy distribution N(W) of the emitted electrons in the model illustrated in FIG. 9 is set as illustrated in equation (1).

[Math. 1]

$$\int_{0eV}^{V_\varphi - V_s} N(W)dW = (\delta - 1)I_p e^{-\frac{V_\varphi - V_s}{\beta}} \quad (1)$$

where δ represents an emission rate of the emitted electrons, $I_p$ represents an irradiation current, and β represents a characteristic parameter of the energy distribution of the emitted electrons. For example, if the sample 116 is a metal, β is set to 8, and if the sample 116 is an insulator, β is set to 4.

By using the above energy distribution model, the electrical characteristics of the sample 116 can be estimated as the equivalent circuit (RC parallel circuit). Further, when the equivalent circuit corresponding to the sample 116 is wired to the current source controlled according to the equation (1), the current source corresponds to the emission current of the emitted electrons, so that the potential contrast image can be simulated. When observing the semiconductor substrate 200 as the sample 116, the contact plug 202 is modeled with the RC parallel circuit to simulate the temporal change of the emission current of the emitted electrons on the basis of the RC constant of the contact plug 202.

Figure 10:
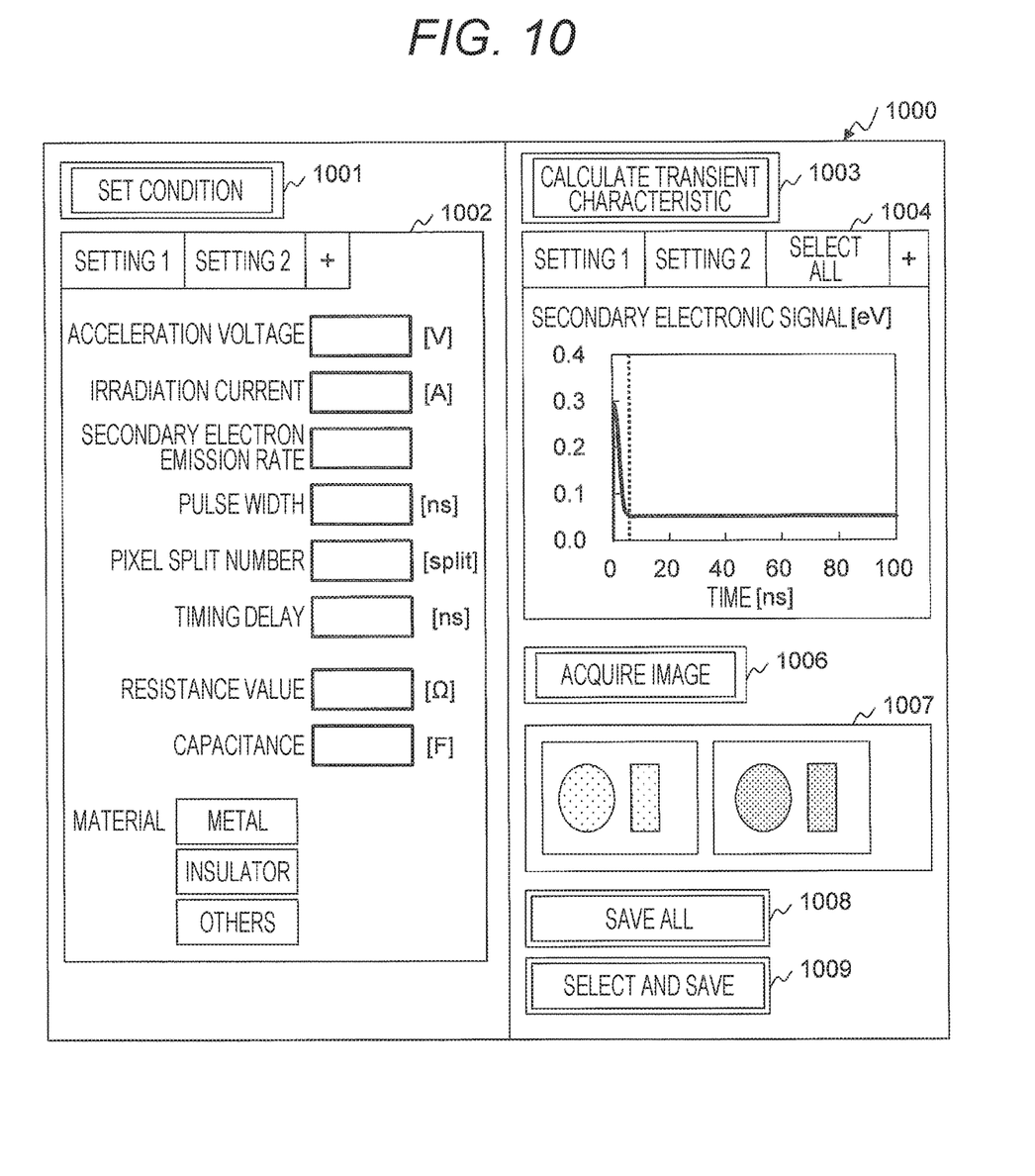
FIG. 10 illustrates an example of an operation screen displayed on the output device according to the second embodiment.

FIG. 10 illustrates an example of an operation screen 1000 displayed on the output device 125 of the second embodiment.

The operation screen 1000 is a screen displayed at the time of setting the observation condition, and includes a condition setting button 1001, a condition setting area 1002, a transient characteristic calculation button 1003, a transient characteristic display area 1004, an image acquisition button 1005, an image display area 1007, and save buttons 1008 and 1009.

The condition setting button 1001 is an operation button for setting the value set in the condition setting area 1002 as a parameter to be included in the simulation setting information. Here, the simulation setting information includes the observation conditions and the transient characteristic conditions.

The condition setting area 1002 is an area for setting the observation conditions and the transient characteristic conditions. The condition setting area 1002 includes an acceleration voltage field, an irradiation current field, an emission rate of the emitted electrons field, a pulse width field, a pixel split number field, a timing delay field, a resistance value field, a capacitance field, and a material selection field.

The acceleration voltage field, the irradiation current field, the pulse width field, the pixel split number field, and the timing delay field are the same as those included in the condition setting area 1002. The emission rate of the emitted electrons, the resistance value field, the capacitance field, and the material selection field are fields for inputting values to be set as the transient characteristic conditions.

Note that different simulation setting information is displayed in a tab format. For each tab, different simulation setting information can be set for each type of structure (e.g., contact plug 202 or the like) of the sample 116.

The transient characteristic calculation button 1003 is an operation button for giving an instruction on execution of simulation. When the transient characteristic calculation button 1003 is operated, the control module 131 performs simulation based on the simulation setting information. The control module 131 records data indicating temporal change of emission current (signal) of emitted electrons in the storage device 122 as a simulation result.

The transient characteristic display area 1004 is an area for displaying a graph illustrating the temporal change of the emission current of the emitted electrons. In the transient characteristic display area 1004 of the present embodiment, a graph corresponding to each piece of simulation setting information is displayed. Note that, by switching the tab, a graph of different simulation setting information can be referred to. When the "select all" tab is selected, a graph compiling graphs of each piece of simulation setting information is displayed.

The image acquisition button 1006 is an operation button for giving an instruction on generation of a potential contrast image using a simulation result. In the present embodiment, the potential contrast image is generated on the basis of the simulation result and the timing delay corresponding to the graph displayed in the transient characteristic display area 1004.

At this time, the control module 131 performs sampling at the detection timing corresponding to the value set in the timing delay field to generate the potential contrast image. The control module 131 may set a plurality of detection timings using the value in the timing delay field as the reference value, and may generate the potential contrast images corresponding to the individual detection timings.

The image display area 1007 is an area for displaying the generated potential contrast image. The save buttons 1008 and 1009 are operation buttons for registering the observation conditions included in the simulation setting information in the condition information 133.

Figure 11:
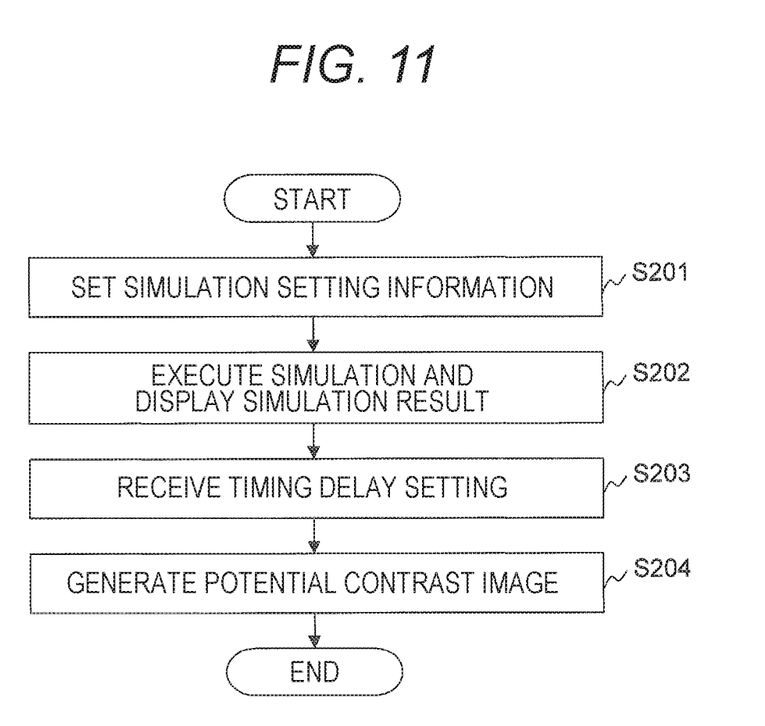
FIG. 11 is a flowchart illustrating processing executed by the scanning electron microscope of the second embodiment to set observation conditions.

FIG. 11 is a flowchart for explaining processing executed when the scanning electron microscope 10 of the second embodiment sets the observation conditions.

The scanning electron microscope 10 starts the processing described below when the transient characteristic calculation button 1003 is operated.

The control unit 102 sets parameters included in the simulation setting information stored in the storage device 122 in the simulation model (step S201). Here, parameters included in the scanning conditions and the transient characteristic conditions are set.

The control unit 102 executes the simulation and displays a graph on the basis of the simulation result (step S202).

When several pieces of simulation setting information are set, the control module 131 performs simulation about each piece of simulation setting information. In this case, the transient characteristic display area 1004 displays a graph corresponding to each piece of simulation setting information.

The control unit 102 receives the setting of the timing delay (step S203).

The control unit 102 outputs a message prompting the user to input a value in the timing delay field and operate the image acquisition button 1006. The user sets a value in the timing delay field on the basis of the graph displayed in the transient characteristic display area 1004, and operates the image acquisition button 1006.

The control unit 102 samples the signals of the emitted electrons on the basis of the set timing delay to generate the potential contrast image (step S204).

Specifically, the control module 131 inputs, to the image generation module 132, data indicating the temporal change of the signals of the emitted electrons and the timing delay, and gives an instruction on generation of a potential contrast image. The image generation module 132 performs signal sampling of emitted electrons using the timing delay, and generates the potential contrast image using the sampled signal of the emitted electrons.

The method of setting the time delay to the observation conditions and the method of registering the observation conditions in the condition information 133 are the same as the methods of the first embodiment, and the description thereof is not repeated. Further, the control method of the scanning electron microscope 10 on the basis of the observation conditions of the second embodiment is also the same as that of the first embodiment, and the description thereof is not repeated.

According to the second embodiment, the scanning electron microscope 10 can generate a high precision potential contrast image of the sample 116 having a fine structure. In addition, the observation conditions can be set without actually irradiating the sample 116 with the pulsed electron beam.

Third Embodiment

In a third embodiment, the structure of the scanning electron microscope 10 is partially different. The third embodiment will be described below by focusing on the difference from the first embodiment.

Figure 12:
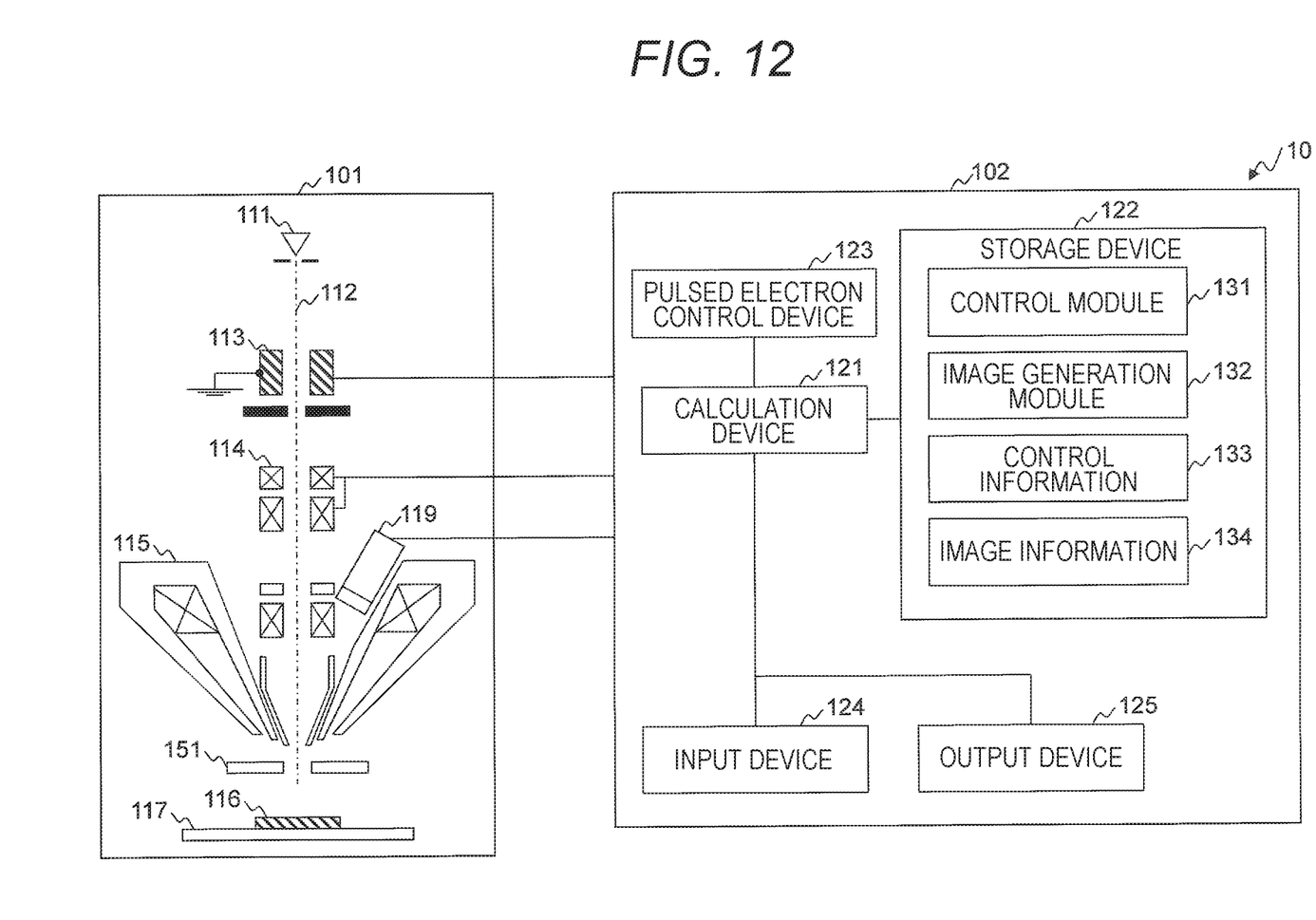
FIG. 12 illustrates an example structure of a scanning electron microscope according to a third embodiment.

FIG. 12 illustrates an example of the structure of the scanning electron microscope 10 of the third embodiment.

In the scanning electron microscope 10 of the third embodiment, the structure of the lens barrel 101 of the electron optical system is partially changed to observe the sample 116 made of, for example, an organic material that is easily charged. The configuration of the control unit 102 of the third embodiment is the same as the configuration of the control unit 102 of the first embodiment, and the description thereof is not repeated.

The lens barrel 101 of the electron optical system of the third embodiment includes an electrode 151 between the objective lens 115 and the sample holder 117 on which the sample 116 is placed. The control unit 102 controls the electric field in the vicinity of the irradiation area of the primary electron beam 112 of the sample 116 using the electrode 151. More specifically, the control unit 102 controls the electrode 151 so that the acceleration voltage of the primary electron beam 112 is low. As a result, the charging of the sample 116 by the primary electron beam 112 can be reduced.

Figure 13:
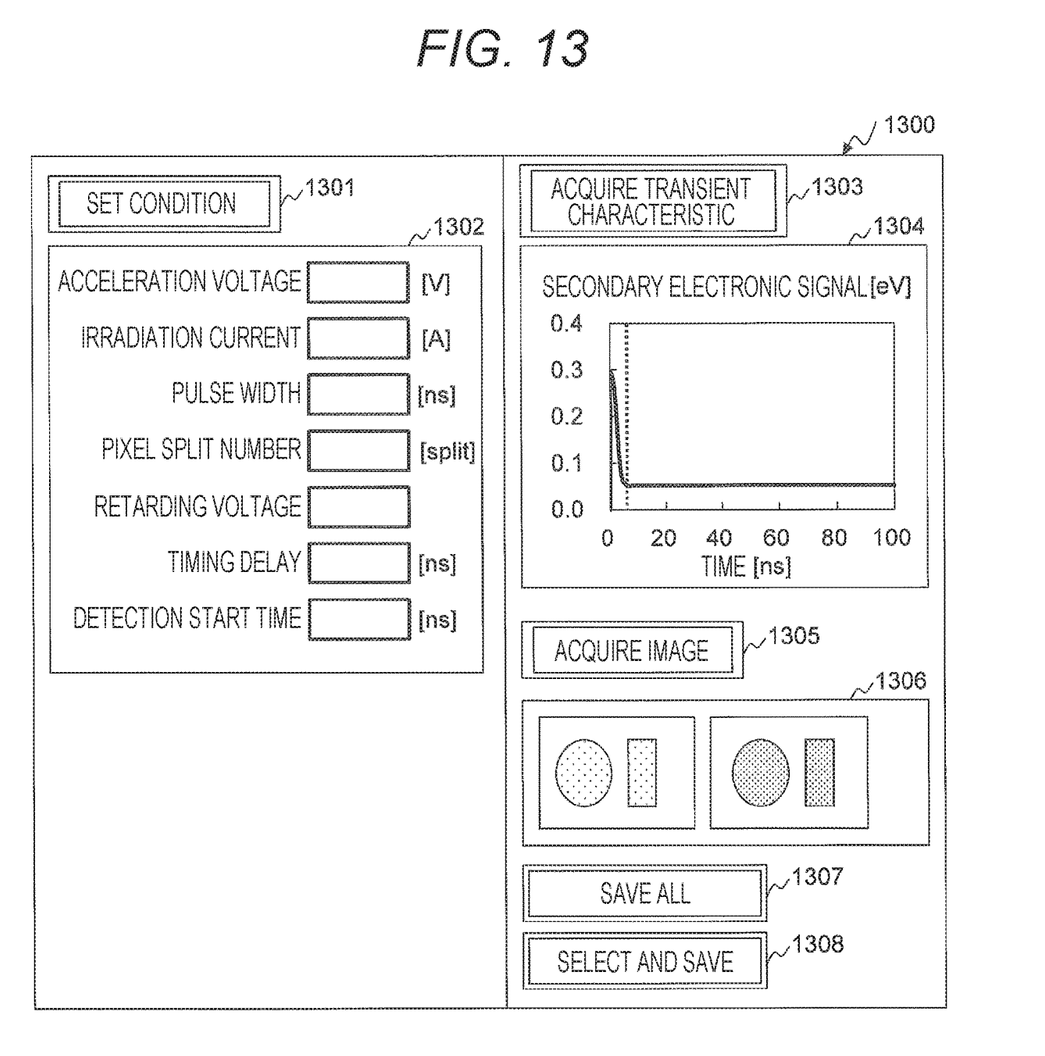
FIG. 13 illustrates an example of an operation screen displayed on the output device of the third embodiment.

FIG. 13 illustrates an example of an operation screen 1300 displayed on the output device 125 of the third embodiment.

The operation screen 1300 is a screen displayed at the time of setting the observation conditions, and includes a condition setting button 1301, a condition setting area 1302, a transient characteristic acquisition button 1303, a transient characteristic display area 1304, an image acquisition button 1305, an image display area 1306, and save buttons 1307 and 1308.

The condition setting button 1301 and the condition setting area 1302 are the same as the condition setting button 601 and the condition setting area 602, respectively. Note that the condition setting area 1302 includes a retarding voltage field. The retarding voltage field is a field for setting parameters for controlling the electrode 151.

The transient characteristic acquisition button 1303, the transient characteristic display area 1304, the image acquisition button 1305, the image display area 1306, and the save buttons 1307 and 1308 are the same as the transient characteristic acquisition button 603, the transient characteristic display area 604, the image acquisition button 605, the image display area 606, and the save buttons 607 and 608, respectively.

The method of setting the time delay to the observation conditions and the method of registering the observation conditions to the condition information 133 in the third embodiment are the same as the methods of the first embodiment, and the description thereof is not repeated. The control method of the scanning electron microscope 10 on the basis of the observation conditions of the third embodiment is also the same as the control method of the first embodiment, and the description thereof is not repeated.

According to the third embodiment, the scanning electron microscope 10 can generate a highly accurate potential contrast image of the sample 116 which is easily charged and has a fine structure.

The present invention is not limited to the above-described embodiments, and may include various modifications. For example, the embodiments described above have been given in detail to facilitate the understanding of the present invention, and are not necessarily limited to those including all constituent components described above. Further, some of the constituent components of each embodiment may be added, deleted, or substituted for by other constituent components.

Further, all or part of the above-described configurations, functions, processing units, processing means, and the like may be formed using hardware by, for example, integrated circuit design. The present invention can also be realized by a program code of software that implements the functions of the embodiment. In this case, a storage medium recording the program code is provided to the computer, and a processor included in the computer reads the program code stored in the storage medium. In this case, the program code itself read from the storage medium implements the functions of the above-described embodiments, and the program code itself and the storage medium storing the same constitute the present invention. As a storage medium for supplying such a program code, for example, a flexible disk, a CD-ROM, a DVD-ROM, a hard disk, a solid state drive (SSD), an optical disk, a magneto-optical disk, a CD-R, a magnetic tape, a non-volatile memory card, a ROM, or the like is used.

Further, the program code for providing the functions described in the present embodiment can be implemented by a wide range of programs or script languages such as, for example, assembler, C/C++, Perl, a shell, PHP, Java (registered trademark).

Further, by distributing the program code of the software for realizing the functions of the embodiment through a network, the program code is stored in a storage means such as a hard disk or a memory of a computer or a storage medium such as a CD-RW or CD-R. Alternatively, a processor included in the computer may read out and execute the program code stored in the storage means or the storage medium.

In the above-described embodiments, the control lines and the information lines have been considered to be necessary for description, but those lines do not always represent all lines required for a manufactured product. Alternatively, all constituent components may be connected mutually.

The invention claimed is:

1. A measuring apparatus that irradiates a sample with a charged particle beam to observe the sample, comprising:
   a particle source that outputs the charged particle beam;
   a lens that collects the charged particle beam;
   a detector that detects signals of emitted electrons emitted from the sample which is irradiated with the charged particle beam; and
   a control device that controls the output of the charged particle beam to be a pulsed charged particle beam and the detection of the signal of the emitted electrons in accordance with an observation condition,
   wherein the control device is configured to
      set the observation condition based on user input;
      set a first parameter of the observation condition for controlling an irradiation cycle of the charged particle beam;
      set a second parameter of the observation condition for controlling a pulse width of the pulsed charged particle beam;
      set a third parameter of the observation condition for controlling detection timing of the signal of the emitted electron within the irradiation time of the pulsed charged particle beam, wherein the third parameter is determined in accordance with a difference in intensity of signals of a plurality of emitted electrons emitted from the irradiation position of the pulsed charged particle beam;
      scan the pulsed charged particle beam across the sample in accordance with the observation condition while detecting the signals of the electrons emitted from the sample;
      generate a potential contrast image of the sample having a fine structure; and
      scan the pulsed charged particle beam using a pixel split control based on a pixel split number representing the irradiation cycle.

2. The measuring apparatus according to claim 1, wherein the control device is further configured to
   cause the particle source to periodically irradiate the sample with a pulsed charged particle beam having a predetermined pulse width in accordance with the first parameter and the second parameter;
   record data indicating a temporal change in intensity of the signals of the plurality of emitted electrons; and
   determine the third parameter in accordance with a difference in intensity of the signals of the plurality of emitted electrons within the irradiation time.

3. The measuring apparatus according to claim 1, wherein the control device is further configured to
   set a fourth parameter indicating a characteristic of the sample;
   use the first parameter, the second parameter, and the fourth parameter to simulate the signals of the plurality of emitted electrons emitted when the sample is periodically irradiated with the pulsed charged particle beam;
   record data indicating a temporal change in intensity of the signals of the plurality of emitted electrons which are obtained from the simulation; and
   determine the third parameter in accordance with a difference in intensity of the signals of the plurality of emitted electrons within the irradiation time.

4. The measuring apparatus according to claim 2, wherein the control device is further configured to
   set a plurality of candidate parameters to determine the detection timing;
   obtain the signals of the emitted electrons detected at the detection timing corresponding to each of the plurality of candidate parameters with reference to the recorded data;
   generate an image using the acquired signals of the emitted electrons; and
   determine the candidate parameter to be set as the third parameter among the plurality of candidate parameters in accordance with an image corresponding to each of the plurality of candidate parameters.

5. The measuring apparatus according to claim 2, wherein the control device is further configured to
   identify a time at which the difference in intensity of the signals of the plurality of emitted electrons is maximum in accordance with the recorded data; and
   set the third parameter in accordance with the identified time.

6. The measuring apparatus according to claim 2, further comprising:
   control mechanism that controls an electric field generated by charging of the sample,
   wherein the control device is further configured to set a fifth parameter for controlling the control mechanism.

7. The measuring apparatus according to claim 4, wherein the control device is further configured to
   display a setting screen for setting parameters to be included in the observation condition; and
   display the image on the setting screen.

8. A method of measuring a sample using an apparatus that irradiates the sample with a charged particle beam to observe the sample, the measuring apparatus including
- a particle source that outputs the charged particle beam,
- a lens that collects the charged particle beam,
- a detector that detects signals of emitted electrons emitted from the sample which is irradiated with the charged particle beam, and
- a control device that controls the output of the charged particle beam and the detection of signals of the emitted electron in accordance with an observation condition, the method comprising
- a first step of setting a first parameter of the observation condition, by the control device, to control an irradiation cycle of the charged particle beam;
- a second step of setting a second parameter of the observation condition, by the control device, to control a pulse width of the charged particle beam to provide a pulsed charged particle beam; and
- a third step of setting a third parameter of the observation condition, by the control device, to control detection timing of the signals of the emitted electrons within the irradiation time of the pulsed charged particle beam, wherein the third parameter is determined in accordance with a difference in intensity of signals of a plurality of emitted electrons emitted from the irradiation position of the pulsed charged particle beam;
- a fourth step of scanning the pulsed charged particle beam across the sample in accordance with the observation condition while detecting the signals of the plurality of emitted electrons emitted from the sample;
- a fifth step of generating a potential contrast image of the sample having a fine structure; and
- a sixth step of scanning the pulsed charged particle beam using a pixel split control based on a pixel split number representing the irradiation cycle.

9. The method according to claim 8, wherein the third step comprises:
- causing, by the control device, the particle source to periodically irradiate the sample with the pulsed charged particle beam having a predetermined pulse width in accordance with the first parameter and the second parameter;
- recording, by the control device, data indicating temporal change in intensity of signal of the plurality of emitted electrons; and
- determining, by the control device, the third parameter in accordance with a difference in intensity of the signals of the plurality of emitted electrons within the irradiation time.

10. The method according to claim 8, wherein the third step comprises;
- setting, by the control device, a fourth parameter indicating a characteristic of the sample;
- using, by the control device, the first parameter, the second parameter, and the fourth parameter to simulate the signals of the plurality of emitted electrons emitted when the sample is periodically irradiated with the pulsed charged particle beam;
- recording, by the control device, data indicating a temporal change in intensity of the signals of the plurality of emitted electrons which is obtained from the simulation; and
- determining, by the control device, the third parameter in accordance with a difference in intensity of the signals of the plurality of emitted electrons within the irradiation time.

11. The method according to claim 9, wherein the step of determining the third parameter comprising:
- setting, by the control device, a plurality of candidate parameters to determine the detection timing;
- acquiring, by the control device, the signal of the emitted electron detected at the detection timing corresponding to each of the plurality of candidate parameters with reference to the recorded data;
- generating, by the control device, an image using the acquired signal of the emitted electrons; and
- determining, by the control device, the candidate parameter to be set as the third parameter from among the plurality of candidate parameters in accordance with the image corresponding to each of the plurality of candidate parameters.

12. The method according to claim 9, wherein the step of determining the third parameter comprises;
- identifying, by the control device, a time at which the difference in intensity of signals of the plurality of emitted electrons is maximum in accordance with the recorded date; and
- setting, by the control device, the third parameter in accordance with the time.

13. The method according to claim 9, further comprising:
- an electric field generated by charging of the sample; and
- setting, by the control device, a fifth parameter for controlling the electric field.

14. The method according to claim 11, further comprising:
- displaying, by the control device, a setting screen for setting the parameter to be included in the observation condition; and
- displaying, by the control device, the image on the setting screen.

15. The method according to claim 10, wherein the step of determining the third parameter comprises:
- setting, by the control device, a plurality of candidate parameters to determine the detection timing;
- acquiring, by the control device, the signal of the emitted electron detected at the detection timing corresponding to each of the plurality of candidate parameters with reference to the recorded data;
- generating, by the control device, an image using the acquired signal of the emitted electrons; and
- determining, by the control device, the candidate parameter to be set as the third parameter from among the plurality of candidate parameters in accordance with the image corresponding to each of the plurality of candidate parameters.

16. The method according to claim 10, wherein the step of determining the third parameter comprises:
- identifying, by the control device, a time at which the difference in intensity of signals of the plurality of emitted electrons is maximum in accordance with the recorded date; and
- setting, by the control device, the third parameter in accordance with the time.

17. The method according to claim 10, further comprising:
- an electric field generated by charging of the sample; and
- setting, by the control device, a fifth parameter for controlling the electric field.

* * * * *